(12) United States Patent
Le Berre et al.

(10) Patent No.: US 9,532,492 B2
(45) Date of Patent: Dec. 27, 2016

(54) ELECTROMAGNETIC PROTECTION DEVICE ABLE TO PROTECT A MICROWAVE CONNECTION BETWEEN A CONNECTOR AND A MICROWAVE ELEMENT

(71) Applicant: THALES, Neuilly sur Seine (FR)

(72) Inventors: Jean-Paul Le Berre, Ploumoguer (FR); Eric Predon, Locmaria Plouzane (FR); Pierre-Yves Hulin, Landeda (FR); Michel Bodenes, Brest (FR)

(73) Assignee: THALES, Courbevoie (FR)

( * ) Notice: Subject to any disclaimer, the term of this patent is extended or adjusted under 35 U.S.C. 154(b) by 411 days.

(21) Appl. No.: 14/368,260

(22) PCT Filed: Dec. 21, 2012

(86) PCT No.: PCT/EP2012/076728
§ 371 (c)(1),
(2) Date: Jun. 23, 2014

(87) PCT Pub. No.: WO2013/093038
PCT Pub. Date: Jun. 27, 2013

(65) Prior Publication Data
US 2014/0367158 A1     Dec. 18, 2014

(30) Foreign Application Priority Data

Dec. 23, 2011 (FR) .................................. 11 04078

(51) Int. Cl.
*H01R 13/648* (2006.01)
*H05K 9/00* (2006.01)
(Continued)

(52) U.S. Cl.
CPC ............ *H05K 9/0064* (2013.01); *H01P 5/085* (2013.01); *H01P 11/00* (2013.01); *H05K 9/0056* (2013.01); *Y10T 29/4902* (2015.01)

(58) Field of Classification Search
CPC ..... H05K 9/0064; H05K 9/0056; H01P 5/085; H01P 11/00
(Continued)

(56) References Cited

U.S. PATENT DOCUMENTS 4,645,288 A * 2/1987 Stursa .................... H01R 24/50
439/581
5,417,578 A * 5/1995 Mroczkowski ...... H01R 23/688
439/101

(Continued)

FOREIGN PATENT DOCUMENTS

| JP | 5586204 A | 6/1980 |
|---|---|---|
| JP | 61100004 A | 5/1986 |
| JP | 2003347468 A | 12/2003 |

OTHER PUBLICATIONS

Marian L Majewski, et al., "Modeling and Characterization of Microstrip-to-Coaxial Transitions", IEEE Transactions on Microwave Theory and Techniques, Aug. 1, 1981, pp. 799-805, vol. MTT-29, No. 8, IEEE Service Center, Piscataway. NJ, USA, XP001366238.

*Primary Examiner* — Sherman Ng
(74) *Attorney, Agent, or Firm* — Baker & Hostetler LLP

(57) ABSTRACT

In the field of wideband microwave circuits placed in a housing, an electromagnetic protection device able to protect a microwave connection between a coaxial microwave connector placed on a housing and at least one element of a microwave circuit contained in said housing is provided. The device is formed by a separate pipe made of a resilient electrically conductive material, and it ensures ground continuity between the electric ground of the microwave circuit and the mechanical ground of the housing.

5 Claims, 1 Drawing Sheet

(51) Int. Cl.
*H01P 5/08* (2006.01)
*H01P 11/00* (2006.01)

(58) Field of Classification Search
USPC .......................................................... 174/359
See application file for complete search history.

(56) References Cited

U.S. PATENT DOCUMENTS

| 2003/0052755 A1* | 3/2003 | Barnes | H01P 5/085 |
| | | | 333/260 |
| 2003/0155989 A1* | 8/2003 | Ling | H01P 5/085 |
| | | | 333/33 |
| 2004/0239454 A1* | 12/2004 | Dove | H01P 5/085 |
| | | | 333/245 |

* cited by examiner

ELECTROMAGNETIC PROTECTION DEVICE ABLE TO PROTECT A MICROWAVE CONNECTION BETWEEN A CONNECTOR AND A MICROWAVE ELEMENT

CROSS-REFERENCE TO RELATED APPLICATIONS

This application is a National Stage of International patent application PCT/EP2012/076728, filed on Dec. 21, 2012, which claims priority to foreign French patent application No. FR 1104078, filed on Dec. 23, 2011, the disclosures of which are incorporated by reference in their entirety.

FIELD OF THE INVENTION

The present invention relates to the field of wideband microwave circuits placed in a housing. The present invention relates more specifically to an electromagnetic protection device able to protect a microwave connection between a connector and a microwave element placed in a housing.

The present invention is used in wideband microwave circuit housings ranging from a few megahertz to several tens of gigahertz.

BACKGROUND

In the microwave field, and more specifically with high frequencies, such as frequencies on the gigahertz scale, unprotected electric connections behave similarly to antennas and are able to receive different parasitic elements present within the housing. These parasitic elements are then transmitted to the circuits and disturb the correct operation of these microwave circuits.

So as to standardize and protect a microwave connection between a connector and a circuit element arranged on a dielectric substrate, it is known to produce a cylinder, or bushing, by mass-production machining of the housing around a microwave connector. A disadvantage of this device is the rigidity thereof. As a result, the mechanical and electric contacts are dependent on the application of a number of tightening sequences at tightening torques above the standard and on the use of specialized tools. In addition, a matching of the structure comprising the bushing(s) and the cover thereof is necessary.

In addition, this hyperstatic assembly is not suitable for use in harsh environmental conditions, such as for an airborne application.

SUMMARY OF THE INVENTION

One object of the invention in particular is to correct the aforementioned disadvantages. This object is achieved by an electromagnetic protection device able to protect a microwave connection between a microwave connector placed on a housing and at least one microwave circuit element contained in said housing, the device being formed by a separate part made of a resilient electrically conductive material and ensuring ground continuity between the electric ground of the microwave circuit and the mechanical ground of the housing and of the cover.

In accordance with a particular feature of the invention, the device is formed by a pipe made of an annealed copper alloy.

In accordance with a further particular feature, the device is made of beryllium copper CuBe2.

A gold-plating treatment is advantageously performed on the outer surface of the device.

In an embodiment, the characteristic impedance of the device is equal to that of the connector and that of the microwave circuit element.

In accordance with a variant, the characteristic impedance of the device is standardized to 50 ohms.

In another embodiment, the inner diameter of the device is equal to 1.73 millimeters, and the outer diameter thereof is 1.93 millimeters.

Another object of the invention is to propose a method for producing the device according to the invention. This object is achieved by a method comprising:

a step of machining a through-hole in the wall of the housing to be traversed, the section of the hole being substantially equal to the section of the protection device, a step of passing the device through the wall of the housing, a step of fixing the connector on the wall of the housing, and a step of passing the connection into the electromagnetic protection device.

The main advantages of the invention described above compared with the systems used conventionally are:

to simplify the current process by compensating for manufacturing and assembly tolerance deviations of the mechanical parts (structure, cover) and by making it less dependent notably on the tolerance ranges of the printed circuit board, mechanical tolerance ranges and tolerance ranges of the cover, to make it possible to obtain mechanical and electrical contact facilitated by the resilient properties of the new device, thus significantly simplifying the process of tightening the cover on the structure by means of a standard tightening of screws, without use of special tools, to prevent successive dismantling operations of the microwave cover during control and test phases from altering the electrical performance, to avoid the matching of the microwave cover with the structure, to reduce the cost price of the function.

BRIEF DESCRIPTION OF THE DRAWINGS

Further features and advantages of the present invention will become clearer upon reading the following description, which is given by way of non-limiting example with reference to the accompanying drawings, in which.

DETAILED DESCRIPTION

Figure 1:
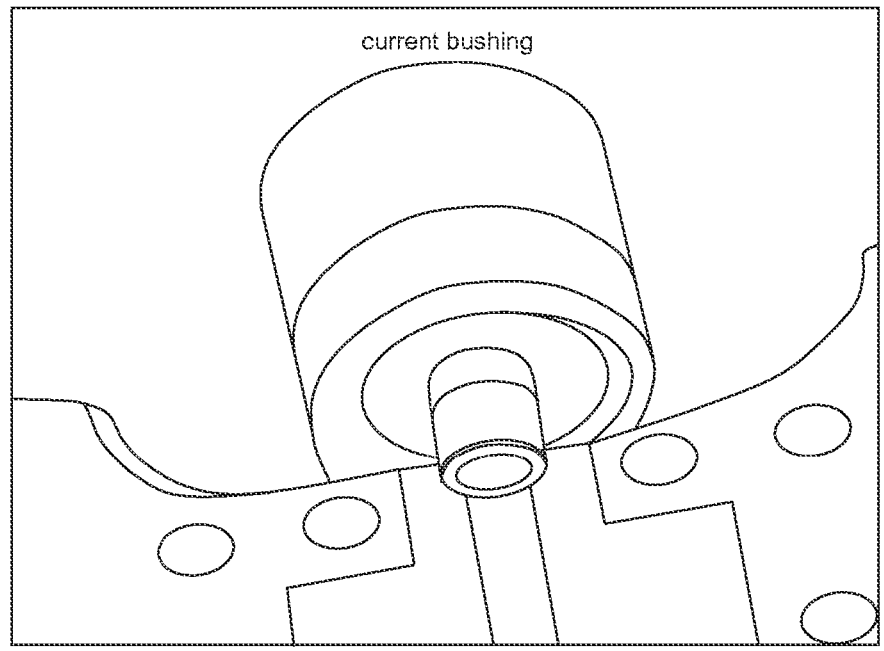
FIG. 1 shows an exemplary embodiment of the protection device prior to the invention.
Figure 2:
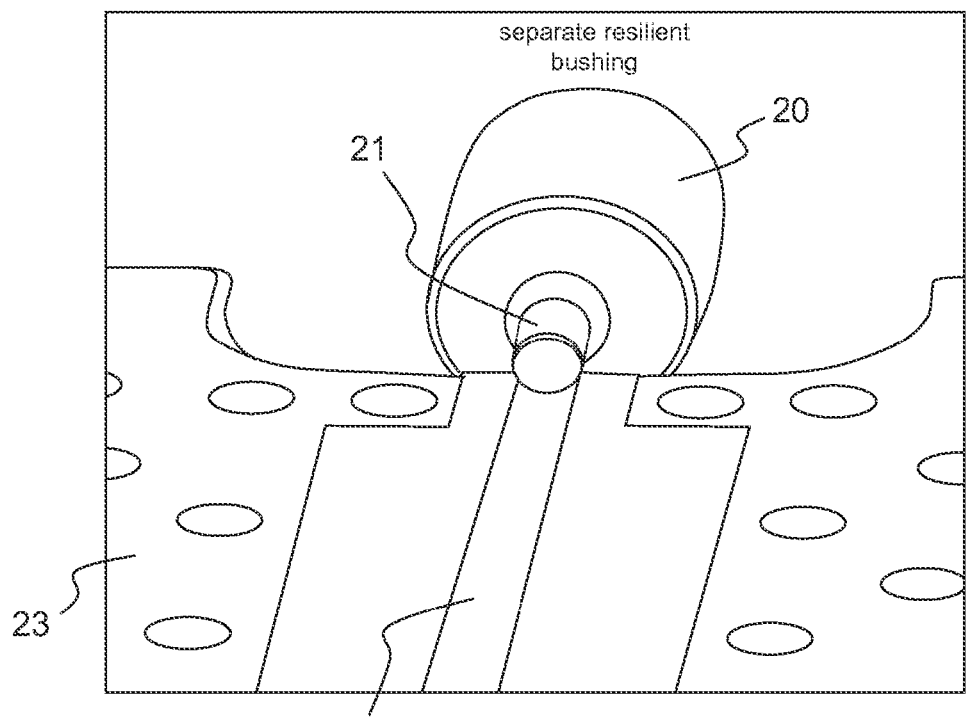
FIG. 2 shows an exemplary embodiment of the protection device according to the invention.

With reference to FIG. 2, the protection device 20 according to the invention is formed by a pipe made of a resilient conductive metal, such as a copper alloy. So as to increase the resilience of the material, the copper alloy is preferably annealed. In accordance with an embodiment, the pipe is substantially cylindrical. In accordance with a specific embodiment, the protection device 20 is made of beryllium copper.

The resilience of the material advantageously makes it possible to compensate for the manufacturing and assembly tolerance deviations of the different mechanical parts, such as the housing, the cover thereof and those of the printed circuit board.

One purpose of this device 20 is to ensure electromagnetic protection around the connection 21 between a microwave connector and the microwave circuit. It also makes it possible to ensure, in combination with the cover, transmission continuity with high immunity. This connection 21, for example, may be the central core of the connector. It should be noted that the device according to the invention is a separate part independent of the microwave connector. The device can be likened to an armored bushing within the housing. The insulation is ensured by connecting the device to ground. This connection to ground is ensured by tightening the cover of the housing against the protection device according to the invention as the housing is closed. The resilience of the material used to produce the separate resilient bushing advantageously makes it possible to reduce the tightening forces of the fixing screws and to thus use standard tools. In addition, the standard tightening of the screws makes it possible to avoid the breakage thereof.

The connection to ground is also ensured between the device and at any contact zone between the connector and the device according to the invention. The continuity between the mechanical ground of the device and the electric ground of the microwave circuit is ensured by tightening the cover on the device 20. The protection device thus ensures a perfect continuity between the different grounds, that is to say the mechanical ground of the housing and of the cover, the electric ground 23 of the microwave circuit, and that of the connector.

In accordance with a specific embodiment, a gold-plating treatment can be applied on the outer surface of the device 20. The thickness of the gold plating is approximately 2 micrometers, for example.

Another purpose of this device is to channel the microwave signal between the connector and the element of the microwave circuit placed at the other end of the device. One objective of the device is to produce a coaxial connection between these two elements.

In some embodiments the core of the connector 21 is soldered on a microwave circuit track 22. At the microwave connector, the signal is transmitted in coaxial mode. At the track 22 of the microwave circuit, the signal is transmitted in a microstrip mode. At the connection, there is thus a changeover between two different transmission modes. So as not to disturb the transmission of the signal and thus avoid the problems of stationary waves, the different dimensions of the separate bushing 20 can be selected such that the characteristic impedance of the device 20 is standardized. The standardized impedance of the device also makes it possible to overcome problems of impedance loss in the general case of connection between a connector and a microwave circuit element.

In accordance with an embodiment that is in no way limiting, the device 20 is formed as a hollow cylinder with a rim of which the outer diameter measures 1.93 millimeters and the inner diameter measures 1.73 millimeters. These different sizes allow the device according to the invention to have a characteristic impedance of 50 ohms. In some embodiments the device 20 will measure 3 millimeters long.

The device 20 according to the invention can be produced by swaging or by machining, for example by bar turning.

The device according to the invention forms a standardized microwave connection device between a connector and a microwave element, such as a printed circuit board, with high radio electric insulation.

One method of producing the device 20 may lie in placing the device in position before placing the connector on the housing. In a first step, a through-hole is machined in the wall of the housing to be traversed, the section of the hole being substantially equal to the section of the protection device. Said device is then slid through the wall of the housing, for example from the outside of the housing to the inside, the inner face of the wall corresponding to the face facing the microwave element, and the outer face corresponding to the opposed face. The device 20 can be fitted to the wall in a clamped or adhesively bonded manner, for example with the aid of conductive adhesive. The connector is then fixed to the wall of the housing, and the connection 21, such as the central core of the connector, is then introduced into the device 20. Of course, the implementation of the invention is not limited to this embodiment, and any equivalent embodiment may be appropriate.

The mechanical qualities of resilience and reproducibility of the electromagnetic protection device according to the invention may advantageously allow a use in harsh environments, such as a military airborne use, and civilian use.

The invention claimed is:

1. An electromagnetic protection device able to protect a microwave connection between a microwave connector placed on a housing and at least one element of a microwave circuit contained in said housing, said device being formed by a separate pipe, ensuring ground continuity between the electric ground of the microwave circuit and the mechanical ground of the housing and of the cover, said device being made of an annealed copper alloy treated by gold plating, of which the inner diameter is dimensioned such that the characteristic impedance of the pipe is equal to that of the connector and that of the element of the microwave circuit.

2. The device as claimed in claim 1, in which said device is made of beryllium copper CuBe2.

3. The device as claimed in claim 1, in which a gold-plating treatment is performed on the outer surface thereof.

4. The device as claimed in claim 1, in which the characteristic impedance thereof is standardized to 50 ohms.

5. The device as claimed in claim 1, in which the inner diameter thereof is equal to 1.73 millimeters and the outer diameter thereof is 1.93 millimeters.

* * * * *